(12) United States Patent
Yang et al.

(10) Patent No.: US 12,057,458 B2
(45) Date of Patent: Aug. 6, 2024

(54) DISPLAY PANEL AND MOBILE TERMINAL

(71) Applicant: TCL CHINA STAR OPTOELECTRONICS TECHNOLOGY CO., LTD., Guangdong (CN)

(72) Inventors: Litao Yang, Guangdong (CN); Xing Ouyang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 497 days.

(21) Appl. No.: 17/600,187

(22) PCT Filed: Sep. 7, 2021

(86) PCT No.: PCT/CN2021/116870
§ 371 (c)(1),
(2) Date: Sep. 30, 2021

(87) PCT Pub. No.: WO2023/024157
PCT Pub. Date: Mar. 2, 2023

(65) Prior Publication Data
US 2023/0053813 A1 Feb. 23, 2023

(30) Foreign Application Priority Data
Aug. 23, 2021 (CN) .......................... 202110966003.0

(51) Int. Cl.
*H01L 27/12* (2006.01)
(52) U.S. Cl.
CPC ...... *H01L 27/1251* (2013.01); *H01L 27/1244* (2013.01)

(58) Field of Classification Search
None
See application file for complete search history.

(56) References Cited

U.S. PATENT DOCUMENTS

| 2013/0038518 A1* | 2/2013 | Tagawa | H01L 27/1244 345/92 |
| 2013/0201610 A1* | 8/2013 | Yamasaki | H05K 1/18 361/679.01 |

FOREIGN PATENT DOCUMENTS

| CN | 110568686 A | 12/2019 |
| CN | 111640764 A | 9/2020 |
| CN | 111785759 A | 10/2020 |
| CN | 112825331 A | 5/2021 |

(Continued)

OTHER PUBLICATIONS

International Search Report in International application No. PCT/CN2021/116870,mailed on Feb. 24, 2022.

(Continued)

*Primary Examiner* — Bilkis Jahan
(74) *Attorney, Agent, or Firm* — Rivka Friedman

(57) ABSTRACT

A display panel and a mobile terminal are provided. The display panel includes a base and a thin film transistor (TFT) layer that is disposed on the base and includes at least two TFTs arranged in parallel. According to the present disclosure, the TFT layer includes at least two TFTs arranged in parallel, thereby resolving the problem that a short circuit between a gate and a source and/or a short circuit between the gate and a drain in the TFT cannot be repaired.

20 Claims, 3 Drawing Sheets

(56) References Cited

FOREIGN PATENT DOCUMENTS

| WO | 2021007774 A1 | 1/2021 |
| WO | 2021104428 A1 | 6/2021 |

OTHER PUBLICATIONS

Written Opinion of the International Search Authority in International application No. PCT/CN2021/116870, malled on Feb. 24, 2022.

* cited by examiner

DISPLAY PANEL AND MOBILE TERMINAL

FIELD OF INVENTION

The present disclosure relates to the field of display technologies, and in particular, to a display panel and a mobile terminal.

BACKGROUND OF INVENTION

Panel driving technologies of a liquid crystal display or an active-matrix driving organic light-emitting diode display gradually tend to adopt a gate drive on array (GOA) technology. The GOA technology is an array substrate driving technology, and is a driving manner using a thin film transistor (TFT) array to implement progressive scanning on a substrate. Currently, a GOA circuit includes a plurality of gate driving units connected in series, and the plurality of gate driving units sequentially output scanning signals to bidirectionally drive the TFT array.

A gate driving circuit includes a plurality of shift registers, and a shift register includes a plurality of TFTs. The shift register usually includes a pull-up control module, a pull-up module, a pull-down module, and a pull-down maintenance module, wherein the pull-up module includes a TFT. To satisfy driving requirements of the GOA circuit, the TFT in the pull-up module is usually set as a large-area entire structure. A short circuit of the TFT may result in abnormal display of a display panel, and further affect the display yield. However, because the pull-up module is in an entire array substrate structure, when a short circuit occurs, a drain part of the short-circuited TFT is cut off merely in a laser manner to resolve a short circuit between a source and a drain of the TFT, and a short circuit between a gate and the source and a short circuit between the gate and the drain cannot be repaired.

SUMMARY OF INVENTION

Technical Problem

The embodiments of the present disclosure provide a display panel and a mobile terminal, to alleviate a problem that a short circuit between a gate and a source and/or a short circuit between the gate and a drain in the TFT of the display panel cannot be repaired.

Technical Solution

To resolve the foregoing problem, the embodiments of the present disclosure provide a display panel, including:
a base; and
a TFT layer, disposed on the base and including at least two TFTs arranged in parallel;
wherein
the TFT layer includes: a first metal layer, a semiconductor layer, and a second metal layer that are sequentially disposed on the base in a stacked manner, and the first metal layer includes at least gates of the TFTs and a first connection portion connecting the gates in parallel; the second metal layer includes at least first electrodes and second electrodes of the TFTs, a second connection portion connecting the first electrodes in parallel, and a third connection portion connecting the second electrodes in parallel; and in one TFT, an orthographic projection of the gate on the base covers orthographic projections of the first electrode and the second electrode on the base.

In the display panel provided in the embodiments of the present disclosure, the TFT layer includes a plurality of TFTs arranged in parallel, any two adjacent TFTs are arranged in sequence in a first direction or a second direction, and the first direction is set to be at a preset angle to the second direction;

the TFT layer includes gap regions located between the TFTs, and the gap region includes a cutting region and a non-cutting region; and the first connection portion is located in the cutting region, one of the second connection portion and the third connection portion is located in the cutting region, and the other is located in the non-cutting region.

In the display panel provided in the embodiments of the present disclosure, the cutting region includes a first cutting region, the non-cutting region includes a first non-cutting region, and the first cutting region and the second cutting region are located between two adjacent TFTs arranged in the first direction;

the first connection portion includes a first connection sub-portion located in the first cutting region, and the second connection portion includes a second connection sub-portion located in the first non-cutting region; and an orthographic projection of the first cutting region on the base does not overlap an orthographic projection of the first non-cutting region on the base.

In the display panel provided in the embodiments of the present disclosure, in the second direction, a width of an orthographic projection of any one of the gates on the base is greater than a width of an orthographic projection of the first connection sub-portion on the base.

In the display panel provided in the embodiments of the present disclosure, the cutting region includes a second cutting region, the non-cutting region includes a second non-cutting region, the second cutting region and the second non-cutting region are located between two adjacent TFTs arranged in the second direction, and the second non-cutting region and the second cutting region are arranged in the second direction;

the first connection portion includes a third connection sub-portion located in the second cutting region, and the second connection portion includes a fourth connection sub-portion located in the second non-cutting region; and an orthographic projection of the second cutting region on the base does not overlap an orthographic projection of the second non-cutting region on the base.

In the display panel provided in the embodiments of the present disclosure, in the second direction, a width of the orthographic projection of the second cutting region on the base is greater than a width of the orthographic projection of the second non-cutting region on the base.

In the display panel provided in the embodiments of the present disclosure, the second cutting region includes a first cutting subregion and a second cutting subregion, the second non-cutting region includes at least one first non-cutting subregion located between the first cutting subregion and the second cutting subregion, and the first cutting subregion, the second cutting subregion, and the first non-cutting subregion are disposed in the second direction.

In the display panel provided in the embodiments of the present disclosure, the first electrode includes a plurality of first teeth portions arranged in parallel and spaced apart from each other, the plurality of first teeth portions are communicated by using the second connection portion; the second electrode includes a plurality of second teeth portions arranged in parallel and spaced apart from each other, the plurality of second teeth portions are communicated by using the third connection portion; and the plurality of first teeth portions and the plurality of second teeth portions are alternately disposed in the first direction, and the second teeth portion is at least partially located in the second cutting region.

In the display panel provided in the embodiments of the present disclosure, the third connection sub-portion includes a plurality of first connection sections that are disposed at intervals and correspond to the plurality of second teeth portions, and an orthographic projection of the second teeth portion on the base is located at a gap between adjacent first connection sections.

In the display panel provided in the embodiments of the present disclosure, the TFT layer further includes a semiconductor layer located between the first metal layer and the second metal layer, the semiconductor layer includes semiconductor sublayers of the TFTs and a fourth connection portion connecting the semiconductor sublayers in parallel, and the fourth connection portion is located in the non-cutting region; and an orthographic projection of the semiconductor sublayer on the base is located within the orthographic projection of the gate on the base.

The embodiments of the present disclosure further provide a mobile terminal, including a display panel and a terminal body, wherein the terminal body is integrated with the display panel, and the display panel includes:

a base; and a TFT layer, disposed on the base and including at least two TFTs arranged in parallel; wherein the TFT layer includes: a first metal layer, a semiconductor layer, and a second metal layer that are sequentially disposed on the base in a stacked manner, and the first metal layer includes at least gates of the TFTs and a first connection portion connecting the gates in parallel; the second metal layer includes at least first electrodes and second electrodes of the TFTs, a second connection portion connecting the first electrodes in parallel, and a third connection portion connecting the second electrodes in parallel; and in one TFT, an orthographic projection of the gate on the base covers orthographic projections of the first electrode and the second electrode on the base.

In the mobile terminal provided in the embodiments of the present disclosure, the TFT layer includes a plurality of TFTs arranged in parallel, any two adjacent TFTs are arranged in sequence in a first direction or a second direction, and the first direction is set to be at a preset angle to the second direction;

the TFT layer includes gap regions located between the TFTs, and the gap region includes a cutting region and a non-cutting region; and the first connection portion is located in the cutting region, one of the second connection portion and the third connection portion is located in the cutting region, and the other is located in the non-cutting region.

In the mobile terminal provided in the embodiments of the present disclosure, the cutting region includes a first cutting region, the non-cutting region includes a first non-cutting region, and the first cutting region and the first non-cutting region are located between two adjacent TFTs arranged in the first direction;

the first connection portion includes a first connection sub-portion located in the first cutting region, and the second connection portion includes a second connection sub-portion located in the first non-cutting region; and an orthographic projection of the first cutting region on the base does not overlap an orthographic projection of the first non-cutting region on the base.

In the mobile terminal provided in the embodiments of the present disclosure, in the second direction, a width of an orthographic projection of any one of the gates on the base is greater than a width of an orthographic projection of the first connection sub-portion on the base.

In the mobile terminal provided in the embodiments of the present disclosure, the cutting region includes a second cutting region, the non-cutting region includes a second non-cutting region, the second cutting region and the second non-cutting region are located between two adjacent TFTs arranged in the second direction, and the second non-cutting region and the second cutting region are arranged in the second direction;

the first connection portion includes a third connection sub-portion located in the second cutting region, and the second connection portion includes a fourth connection sub-portion located in the second non-cutting region; and an orthographic projection of the second cutting region on the base does not overlap an orthographic projection of the second non-cutting region on the base.

In the mobile terminal provided in the embodiments of the present disclosure, in the second direction, a width of the orthographic projection of the second cutting region on the base is greater than a width of the orthographic projection of the second non-cutting region on the base.

In the mobile terminal provided in the embodiments of the present disclosure, the second cutting region includes a first cutting subregion and a second cutting subregion, the second non-cutting region includes at least one first non-cutting subregion located between the first cutting subregion and the second cutting subregion, and the first cutting subregion, the second cutting subregion, and the first non-cutting subregion are disposed in the second direction.

In the mobile terminal provided in the embodiments of the present disclosure, the first electrode includes a plurality of first teeth portions arranged in parallel and spaced apart from each other, the plurality of first teeth portions are communicated by using the second connection portion; the second electrode includes a plurality of second teeth portions arranged in parallel and spaced apart from each other, the plurality of second teeth portions are communicated by using the third connection portion; and the plurality of first teeth portions and the plurality of second teeth portions are alternately disposed in the first direction, and the second teeth portion is at least partially located in the second cutting region.

In the mobile terminal provided in the embodiments of the present disclosure, the third connection sub-portion includes a plurality of first connection sections that are disposed at intervals and correspond to the plurality of second teeth portions, and an orthographic projection of the second teeth portion on the base is located at a gap between adjacent first connection sections.

In the mobile terminal provided in the embodiments of the present disclosure, the TFT layer further includes a semiconductor layer located between the first metal layer and the second metal layer, the semiconductor layer includes semiconductor sublayers of the TFTs and a fourth connection portion connecting the semiconductor sublayers in parallel, and the fourth connection portion is located in the non-cutting region; and an orthographic projection of the semiconductor sublayer on the base is located within the orthographic projection of the gate on the base.

Beneficial Effects

A display panel and a mobile terminal are provided in the present disclosure. The display panel includes a base and a TFT layer that is disposed on the base and includes at least two TFTs arranged in parallel. The TFT layer includes a first metal layer, a semiconductor layer, and a second metal layer that are sequentially disposed on the base in a stacked manner. The first metal layer includes at least gates of the TFTs and a first connection portion connecting the gates in parallel. The second metal layer includes at least first electrodes and second electrodes of the TFTs, a second connection portion connecting the first electrodes in parallel, and a third connection portion connecting the second electrodes in parallel. In the TFT, an orthographic projection of the gate on the base covers orthographic projections of the first electrode and the second electrode on the base. According to the present disclosure, the TFT layer is set to include at least two TFTs arranged in parallel, thereby resolving the problem that a short circuit between the gate and the first electrode and a short circuit between the gate and the second electrode in the TFT cannot be repaired in the related art.

BRIEF DESCRIPTION OF DRAWINGS

The following describes specific implementations of the present disclosure in detail with reference to the accompanying drawings, to make the technical solutions and other beneficial effects of the present disclosure obvious.

DETAILED DESCRIPTION OF PREFERRED EMBODIMENTS

The present disclosure provides a display panel and a mobile terminal. To make the objectives, technical solutions, and effects of the present disclosure clearer and more explicit, the following further describes the present disclosure in detail with reference to the accompanying drawings and embodiments. It is to be understood that the specific embodiments described herein are merely used to explain the present disclosure but are not intended to limit the present disclosure.

Figure 1:
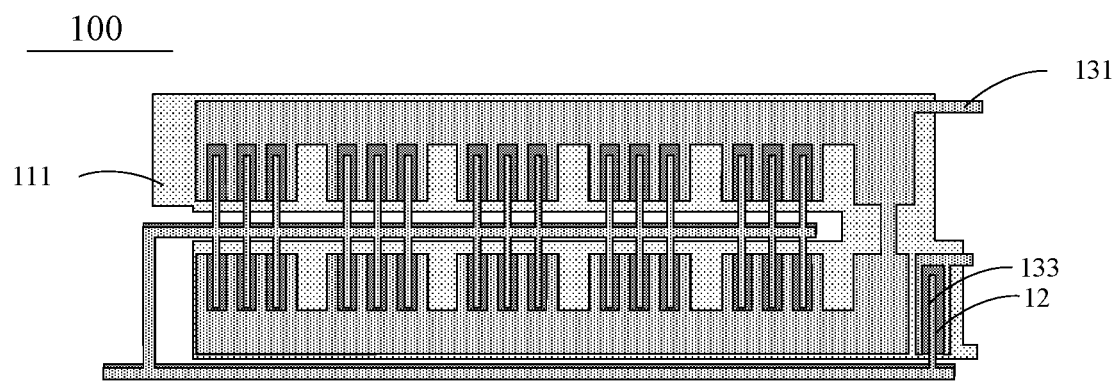
FIG. 1 is a schematic diagram of a structure of a TFT of a display panel in the related art.

Referring to FIG. 1, FIG. 1 is a schematic diagram of a structure of a TFT of a display panel in the related art.

In the related art, a gate 111 driving circuit includes a plurality of shift registers, and a shift register includes a plurality of TFTs 100. The shift register generally includes a pull-up control module, a pull-up module, a pull-down module, and a pull-down maintenance module. The pull-up module includes a TFT 100, and the TFT 100 includes a gate 111, a semiconductor layer 12, a first electrode 131, and a second electrode 133 that are sequentially disposed on a base in a stacked manner. To meet driving requirements of a GOA circuit, the TFT 100 in the pull-up module is usually set as a large-area entire structure. A short circuit of the TFT 100 may result in abnormal display of a display panel, and further affect the display yield. However, because the pull-up module is in an entire array substrate structure, when a short circuit occurs, a drain part of the short-circuited TFT 100 is cut off merely in a laser manner to resolve a short circuit between a source and a drain of the TFT 100, and a short circuit between the gate 111 and the source and a short circuit between the gate 111 and the drain cannot be repaired. In view of this, the embodiments of the present disclosure provide a display panel to alleviate the foregoing defects.

Referring to FIGS. 2 to 5, the present disclosure provides a display panel. The display panel includes a base (not shown in the figure) and a TFT layer 10 that is disposed on the base and includes at least two TFTs 100 arranged in parallel. The TFT layer 10 includes a first metal layer 11, a semiconductor layer 12, and a second metal layer 13 that are sequentially disposed on the base in a stacked manner. The first metal layer 11 includes at least gates 111 of the TFTs 100 and a first connection portion 112 connecting the gates 111 in parallel. The second metal layer 13 includes at least first electrodes 131 and second electrodes 133 of the TFTs 100, a second connection portion 132 connecting the first electrodes 131 in parallel, and a third connection portion 134 connecting the second electrodes 133 in parallel. In one TFT 100, an orthographic projection of the gate 111 on the base covers orthographic projections of the first electrode 131 and the second electrode 133 on the base. According to the present disclosure, the TFT layer 10 is set to include at least two TFTs 100 arranged in parallel, thereby resolving the problem that a short circuit between the gate 111 and the first electrode 131 and/or a short circuit between the gate 111 and the second electrode 133 in the TFT 100 cannot be repaired in the related art.

Features of the display panel provided by the present disclosure are described below with reference to specific implementations.

Figure 2:
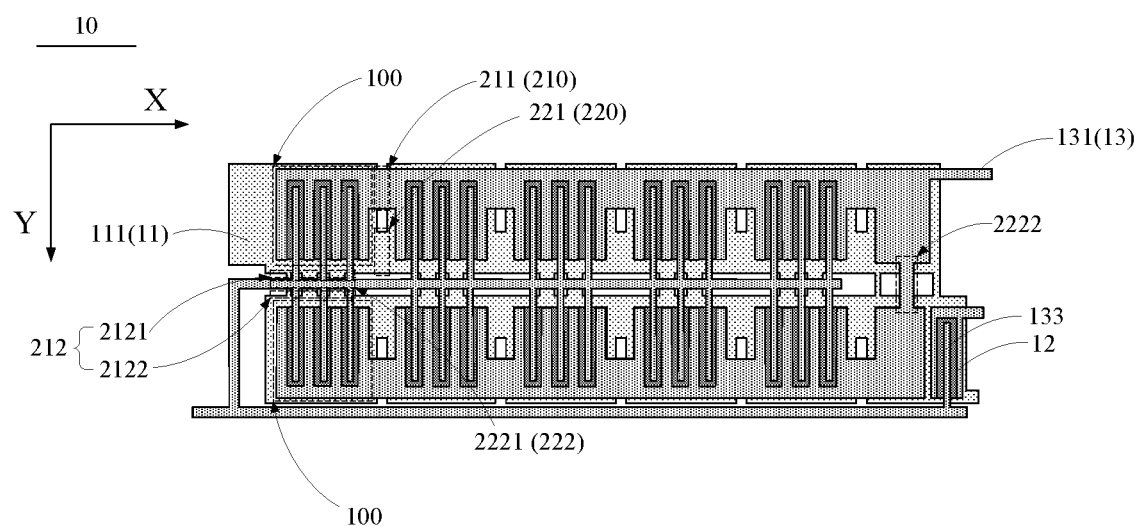
FIG. 2 is a schematic diagram of a structure of a TFT of a display panel according to an embodiment of the present disclosure.
Figure 3:
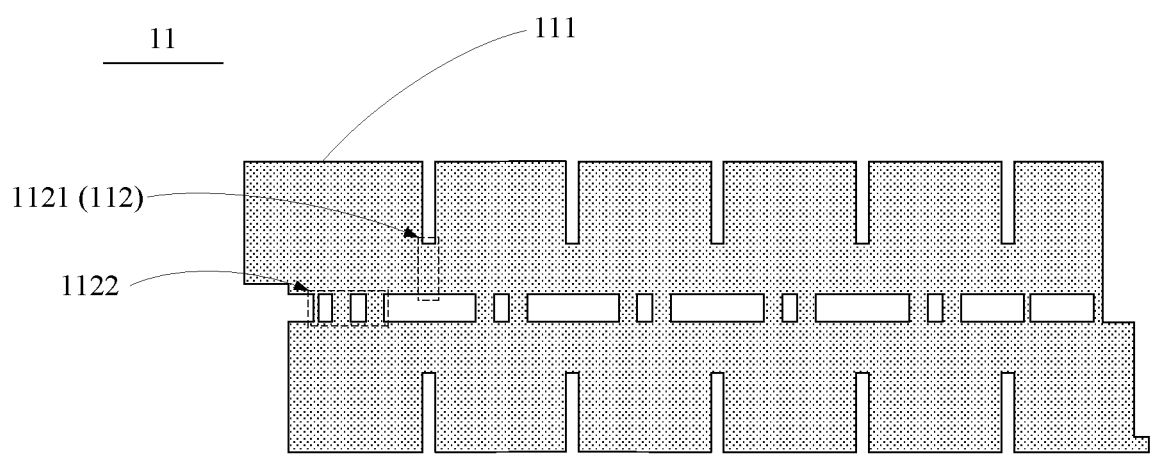
FIG. 3 is a top view of a first metal layer of a display panel according to an embodiment of the present disclosure.
Figure 4:
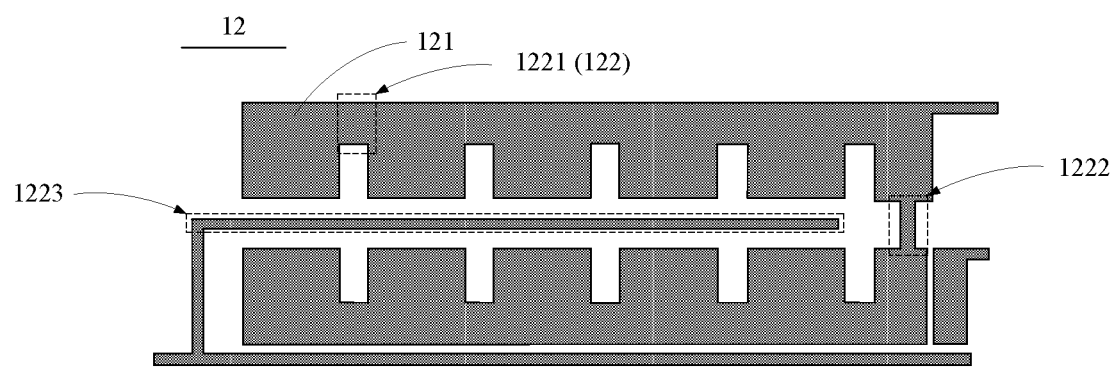
FIG. 4 is a top view of a semiconductor layer of a display panel according to an embodiment of the present disclosure.
Figure 5:
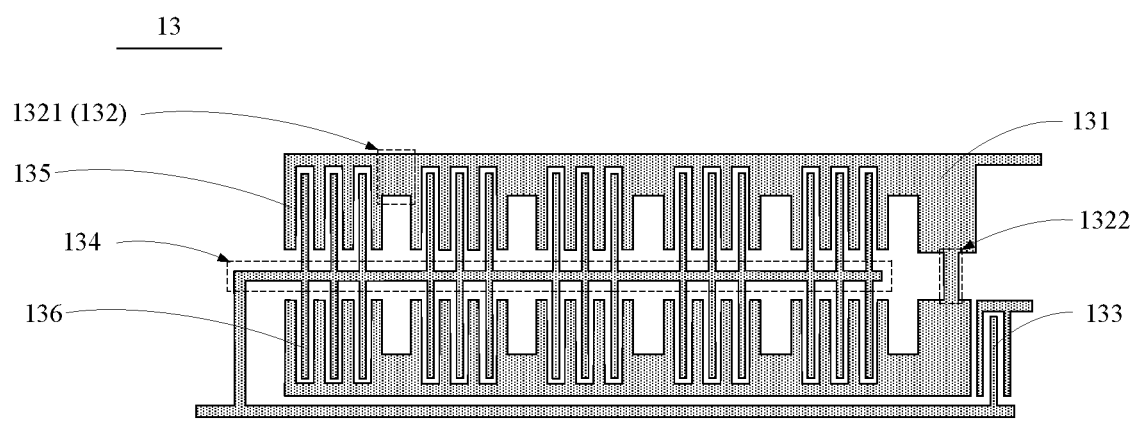
FIG. 5 is a top view of a second metal layer of a display panel according to an embodiment of the present disclosure.

Refer to FIGS. 2 to 5. FIG. 2 is a schematic diagram of a structure of a TFT of a display panel according to an embodiment of the present disclosure. FIG. 3 is a top view of a first metal layer of a display panel according to an embodiment of the present disclosure. FIG. 4 is a top view of a semiconductor layer of a display panel according to an embodiment of the present disclosure. FIG. 5 is a top view of a second metal layer of a display panel according to an embodiment of the present disclosure.

The present embodiment provides a display panel. The display panel includes a base (not shown in the figure) and a TFT layer 10 that is disposed on the base and includes at least two TFTs 100 arranged in parallel. The TFT layer 10 includes a first metal layer 11, a semiconductor layer 12, and a second metal layer 13 that are sequentially disposed on the base in a stacked manner.

It should be noted that, in the present embodiment, the base may include a rigid substrate or a flexible substrate. When the base is a rigid substrate, the material may be metal or glass; and when the base is a flexible substrate, the material may include at least one of acrylic resin, methacrylic resin, polyisoprene, vinyl resin, epoxy-based resin, polyurethane-based resin, cellulose resin, silicone resin, polyimide-based resin, and polyamide-based resin. The material of the base is not limited in the present embodiment.

The materials of the first metal layer 11 and the second metal layer 13 may include at least one metal of molybdenum (Mo), aluminum (Al), platinum (Pt), palladium (Pd), argentum (Ag), magnesium (Mg), aurum (Au), nickel (Ni), neodymium (Nd), iridium (Ir), chromium (Cr), calcium (Ca), titanium (Ti), tantalum (Ta), and wolfram (W). The materials of the first metal layer 11 and the second metal layer 13 are not limited in the present embodiment.

The semiconductor layer 12 includes, but is not limited to, an oxide semiconductor layer and a polysilicon semiconductor layer, which are not specifically limited in the present embodiment.

In the present embodiment, the first electrode 131 and the second electrode 133 are located on same film layer. One of the first electrode 131 and the second electrode 133 is a source of the TFT layer 10, and the other is a drain of the TFT layer 10. Specifically, the first electrode 131 is the source, and the second electrode 133 is the drain.

It should be noted that, in the present embodiment, descriptions are made using an example in which the first electrode 131 is the source, and the second electrode 133 is the drain. However, types of the first electrode 131 and the second electrode 133 are not limited in the present embodiment.

In the present embodiment, the first metal layer 11 includes at least gates 111 of the TFTs 100 and a first connection portion 112 connecting the gates 111 in parallel. The second metal layer 13 includes at least first electrodes 131 and second electrodes 133 of the TFTs 100, a second connection portion 132 connecting the first electrodes 131 in parallel, and a third connection portion 134 connecting the second electrodes 133 in parallel. In one TFT 100, an orthographic projection of the gate 111 on the base covers orthographic projections of the first electrode 131 and the second electrode 133 on the base.

In the present embodiment, the TFT layer 10 includes a plurality of TFTs 100 arranged in parallel, any two adjacent TFTs 100 are arranged in sequence in a first direction or a second direction, and the first direction is set to be at a preset angle to the second direction. As shown in FIG. 2, the first direction is an X direction, and the second direction is a Y direction. It should be noted that, a range of the preset angle and directions of the first direction and the second direction are not limited in the present embodiment. However, for ease of description, descriptions are made in the present embodiment using an example in which the preset angle is 90 degrees, the first direction is an X direction, and the second direction is a Y direction.

In the present embodiment, the TFT layer 10 includes gap regions located between the TFTs 100. The gap region includes a cutting region 210 and a non-cutting region 220. The first connection portion 112 is located in the cutting region 210. One of the second connection portion 132 and the third connection portion 134 is located in the cutting region 210, and the other is located in the non-cutting region 220.

Compared with the related art, in the present embodiment, a TFT 100 with a relatively larger area is replaced with the plurality of TFTs 100 arranged in parallel, any two adjacent TFTs 100 are arranged in sequence in the first direction or the second direction, and the first direction is set to be at a preset angle to the second direction. The TFT layer 10 includes the gap regions located between the TFTs 100, and the gap region includes the cutting region 210 and the non-cutting region 220. When a short circuit occurs between the gate 111 and the second electrode 133 of any one of the TFTs 100, the first connection portion 112 is located in the cutting region 210, the third connection portion 134 is located in the cutting region 210, the second connection portion 132 is located in the non-cutting region 220, and laser cutting is performed on the gate 111 and the second electrode 133 that are located in the cutting region 210, so that other intact TFTs 100 continue to work, thereby resolving the problem that a short circuit between the gate 111 and the second electrode 133 in any one of the TFTs 100 in the TFT layer 10 cannot be repaired in the related art.

In an embodiment, when a short circuit occurs between the gate 111 and the first electrode 131 of any one of the TFTs 100, the first connection portion 112 is located in the cutting region 210, the second connection portion 132 is located in the cutting region 210, the third connection portion 134 is located in the non-cutting region 220, and laser cutting is performed on the gate 111 and the first electrode 131 that are located in the cutting region 210, so that other intact TFTs 100 continue to work.

It may be understood that, in the present embodiment, the cutting region 210 and the non-cutting region 220 are not fixed. When a short circuit occurs between the gate 111 and the first electrode 131 of any one of the TFTs 100, and/or a short circuit occurs between the gate 111 and the second electrode 133 of any one of the TFTs 100, the first connection portion 112 is disposed in the cutting region 210, one of the second connection portion 132 and the third connection portion 134 is disposed in the cutting region 210, and laser cutting can be performed on a damaged part, so that other intact TFTs 100 continue to work.

Specifically, in the present embodiment, descriptions are made using an example in which that the first connection portion 112 is located in the cutting region 210, the second connection portion 132 is located in the non-cutting region 220, and the third connection portion 134 is located in the cutting region 210.

In the present embodiment, the cutting region 210 includes a first cutting region 211, the non-cutting region 220 includes a first non-cutting region 221, and the first cutting region 211 and the first non-cutting region 221 are located between two adjacent TFTs 100 arranged in the first direction. The first connection portion 112 includes a first connection sub-portion 1121 located in the first cutting region 211. The second connection portion 132 includes a second connection sub-portion 1321 located in the first non-cutting region 221. A length of an orthographic projection of the second connection sub-portion 1321 on the base is greater than a length of an orthographic projection of the first connection sub-portion 1121 on the base.

Specifically, in the present embodiment, the first cutting region 211 and the first non-cutting region 221 are arranged in the second direction, and an orthographic projection of the first cutting region 211 on the base does not overlap an orthographic projection of the first non-cutting region 221 on the base.

It should be noted that, in the present embodiment, in the second direction, a width of an orthographic projection of any one of the gates 111 on the base is greater than a width of the orthographic projection of the first connection sub-portion 1121 on the base. It may be understood that, in the present embodiment, the width of the orthographic projection of any one of the gates 111 on the base is set to be greater than the width of the orthographic projection of the first connection sub-portion 1121 on the base, thereby reducing a layout size of the TFT 100, and saving space. In addition, when the gate 111 is short-circuited, an impact on the cutting caused by the excessively wide first connection sub-portion 1121 can be avoided.

It may be understood that widths of the first connection portion 112, the second connection portion 132, and the third connection portion 134 are related to preparation processes thereof. This is not limited in the present embodiment.

In the present embodiment, the cutting region 210 includes a second cutting region 212, the non-cutting region 220 includes a second non-cutting region 222, the second cutting region 212 and the second non-cutting region 222 are located between two adjacent TFTs 100 arranged in the second direction, and the second non-cutting region 222 and the second cutting region 212 are arranged in the second direction. The first connection portion 112 includes a third connection sub-portion 1122 located in the second cutting region 212, and the second connection portion 132 includes a fourth connection sub-portion 1322 located in the second non-cutting region 222. An orthographic projection of the second cutting region 212 on the base does not overlap an orthographic projection of the second non-cutting region 222 on the base. Further, in the second direction, a width of the orthographic projection of the second cutting region 212 on the base is greater than a width of the orthographic projection of the second non-cutting region 222 on the base, thereby increasing space of the second cutting region 212, and avoiding unnecessary damage to another intact film layer during cutting of a damaged film layer in the second cutting region 212.

Specifically, in the present embodiment, the second cutting region 212 includes a first cutting subregion 2121 and a second cutting subregion 2122, and the second non-cutting region 222 includes at least one first non-cutting subregion 2221 located between the first cutting subregion 2121 and the second cutting subregion 2122. The first cutting subregion 2121, the second cutting subregion 2122, and the first non-cutting subregion 2221 are arranged in the second direction. A width of an orthographic projection of the first cutting subregion 2121 on the base is not less than a width of an orthographic projection of the first non-cutting subregion 2221 on the base, and a width of an orthographic projection of the second cutting subregion 2122 on the base is not less than the width of the orthographic projection of the first non-cutting subregion 2221 on the base.

It should be noted that, in the embodiment, the second non-cutting region 222 further includes a second non-cutting subregion 2222 disposed at an interval from the second cutting region 212. The second non-cutting subregion 2222 is at a preset angle to the second cutting region 212, and the fourth connection sub-portion 1322 is located in the second non-cutting subregion 2222. It may be understood that the second cutting region 212 and the second non-cutting subregion 2222 are disposed at an interval in the present embodiment, thereby increasing peripheral space of the third connection sub-portion 1122 and the fourth connection sub-portion 1322, and avoiding damage to another film layer when one of the third connection sub-portion 1122 and the fourth connection sub-portion 1322 requires to be cut off.

In the present embodiment, the second electrode 133 is at least partially located in the second cutting region 212, and the third connection portion 134 is located in the first non-cutting subregion 2221. Specifically, in the second direction, one of the adjacent second electrodes 133 is at least partially located in the first cutting subregion 2121, the other is located in the second cutting subregion 2122, and the third connection portion 134 is located between the first cutting subregion 2121 and the second cutting subregion 2122.

It may be understood that in the present embodiment, in the first direction, the cutting region 210 includes the first cutting region 211, and the non-cutting region 220 includes the first non-cutting region 221. The first connection portion 112 includes a first connection sub-portion 1121 located in the first cutting region 211, the second connection portion 132 includes a second connection sub-portion 1321 located in the first non-cutting region 221, and the orthographic projection of the first cutting region 211 on the base does not overlap the orthographic projection of the first non-cutting region 221 on the base. In the second direction, the cutting region 210 includes the second cutting region 212, and the non-cutting region 220 includes the second non-cutting region 222. The first connection portion 112 includes the third connection sub-portion 1122 located in the second cutting portion 212, and the second connection portion 132 includes the fourth connection sub-portion 1322 located in the second non-cutting region 222. The orthographic projection of the second cutting region 212 on the base does not overlap the orthographic projection of the second non-cutting region 222 on the base. In this way, the cutting region 210 is completely separated from the non-cutting region 220, space of the cutting region 210 is increased, and damage to another intact film layer in any one of the TFTs 100 in a process of cutting off a damaged film layer when a short circuit occurs between film layers in the TFT 100 in the TFT layer 10 is avoided.

In addition, when a short circuit occurs between the gate 111 and the second electrode 133 of any one of the TFTs 100, the first connection portion 112 is located in the cutting region 210, the third connection portion 134 is located in the cutting region 210, the second connection portion 132 is located in the non-cutting region 220, and laser cutting is performed on the gate 111 and the second electrode 133 that are located in the cutting region 210, so that other intact TFTs 100 continue to work, thereby resolving the problem that the short circuit between the gate 111 and the second electrode 133 in any one of the TFTs 100 in the TFT layer 10 cannot be repaired in the related art.

In the present embodiment, the first electrode 131 includes a plurality of first teeth portions 135 arranged in parallel and spaced apart from each other. The plurality of first teeth portions 135 are communicated by using the second connection portion 132. The second electrode 133 includes a plurality of second teeth portions 136 arranged in parallel and spaced apart from each other. The plurality of second teeth portions 136 are communicated by using the third connection portion 134. The plurality of first teeth portions 135 and the plurality of second teeth portions 136 are alternately disposed in the first direction, and the second teeth portion 136 is at least partially located in the second cutting region 212.

Further, the second teeth portion 136 is at least partially located in the second cutting region 212. In the second direction, one of the adjacent second teeth portions 136 is at least partially located in the first cutting subregion 2121, the other is located in the second cutting subregion 2122, and the third connection portion 134 is located between the first cutting subregion 2121 and the second cutting subregion 2122.

In the present embodiment, in the first direction, the third connection sub-portion 1122 includes a plurality of first connection sections (not marked in the figure) that are disposed at intervals and correspond to the plurality of second teeth portions 136. An orthographic projection of the second teeth portion 136 on the base is located at a gap between adjacent first connection sections. It may be understood that, in the present embodiment, the first electrode 131 includes the plurality of first teeth portions 135 arranged in parallel and spaced apart from each other. The second electrode 133 includes the plurality of second teeth portions 136 arranged in parallel and spaced apart from each other. The plurality of first teeth portions 135 and the plurality of second teeth portions 136 are alternately disposed in the first direction, thereby increasing the width of a channel between the first electrode 131 and the second electrode 133, reducing a layout size of the TFT 100, and saving space.

In the present embodiment, the TFT layer 10 further includes a semiconductor layer 12 located between the first metal layer 11 and the second metal layer 13. The semiconductor layer 12 includes semiconductor sublayers 121 of the TFTs 100 and a fourth connection portion 122 connecting the semiconductor sublayers 121 in parallel. The fourth connection portion 122 is located in the non-cutting region 220. An orthographic projection of the semiconductor sublayer 121 on the base is located within the orthographic projection of the gate 111 on the base.

Specifically, in the first direction, the fourth connection portion 122 includes a fifth connection sub-portion 1221 located in the first non-cutting region 221 and a sixth connection sub-portion 1222. An orthographic projection of the fifth connection sub-portion 1221 on the base is located within the orthographic projection of the second connection sub-portion 1321 on the base, and an orthographic projection of the sixth connection sub-portion 1222 on the base is located within the orthographic projection of the third connection portion 134 on the base. In the second direction, the fourth connection portion 122 includes a seventh connection sub-portion 1223 located in the second non-cutting region 222, and an orthographic projection of the seventh connection sub-portion 1223 on the base is located within the orthographic projection of the fourth connection sub-portion 1322 on the base. It may be understood that, in the present embodiment, a projection of the second metal layer 13 on the base is set to cover a projection of the semiconductor layer 12 on the base, thereby saving space while avoiding the blockage of the cutting region 210 by the semiconductor layer located in the gap region, and providing a larger operating range for laser repair.

It should be noted that, examples in which the orthographic projection of the fifth connection sub-portion 1221 on the base is located within the orthographic projection of the second connection sub-portion 1321 on the base, the orthographic projection of the sixth connection sub-portion 1222 on the base is located within the orthographic projection of the third connection portion 134 on the base, and the orthographic projection of the seventh connection sub-portion 1223 on the base is located within the orthographic projection of the fourth connection sub-portion 1322 on the base are merely used for illustration, and positions of the fifth connection sub-portion 1221, the sixth connection sub-portion 1222, and the seventh connection sub-portion 1223 are not limited in the present embodiment.

In the present embodiment, the display panel includes a GOA circuit located on the base. The GOA circuit includes a pull-up control module, a pull-up module, a pull-down module, and a pull-down maintenance module. At least one of the pull-up control module, the pull-up module, the pull-down module, and the pull-down maintenance module includes the plurality of TFTs 100 arranged in parallel.

Specifically, in the present embodiment, descriptions are made using an example in which the pull-up module includes the plurality of TFTs 100 arranged in parallel. Reference may be made to any one of the above embodiments of the display panel for a specific structure of the TFT 100, and details are not described in the present embodiment of the present disclosure again.

It may be understood that, in the present disclosure, the foregoing pull-up module is set to include at least two TFTs arranged in parallel, thereby resolving the defect that the pull-up module includes a TFT 100, the TFT 100 in the pull-up module is usually set as a large-area entire structure to meet driving requirements of the GOA circuit, and when the TFT is short-circuited, a short circuit between the gate 111 and the first electrode 131, and a short circuit between the gate 111 and the second electrode 133 cannot be repaired, and further resolving the problem of a poor horizontal line caused by the failure of any module of the GOA circuit in the related art.

The embodiments of the present disclosure further provide a mobile terminal including the display panel and a terminal body described in any one of the above embodiments, and the terminal body is integrated with the display panel.

Reference may be made to any one of the above embodiments of the display panel for a specific structure of the display panel, and details are not described in the present embodiment of the present disclosure again.

In the present embodiment, the terminal body may include a middle frame, sealant, and the like, which is not limited herein.

In specific applications, the mobile terminal may be a smartphone, a tablet computer, a notebook computer, a smart bracelet, a smart watch, smart glasses, a smart helmet, a desktop computer, a smart TV, a digital camera, or the like.

Based on the above, a display panel and a mobile terminal are provided in the present embodiment of the present disclosure. The display panel includes a base and a TFT layer that is disposed on the base and includes at least two TFTs arranged in parallel. The TFT layer includes a first metal layer, a semiconductor layer, and a second metal layer that are sequentially disposed on the base in a stacked manner. The first metal layer includes at least gates of the TFTs and a first connection portion connecting the gates in parallel. The second metal layer includes at least first electrodes and second electrodes of the TFTs, a second connection portion connecting the first electrodes in parallel, and a third connection portion connecting the second electrodes in parallel. In one TFT, an orthographic projection of the gate on the base covers orthographic projections of the first electrode and the second electrode on the base. According to the present disclosure, the TFT layer includes at least two TFTs arranged in parallel, thereby resolving the problem that a short circuit between a gate and a source and the short circuit between the gate and a drain in the TFT cannot be repaired.

It is to be understood that, for a person of ordinary skill in the art, equivalent replacements and changes may be made to the technical solutions of the present disclosure and the inventive concept thereof, and these changes or equivalent replacements shall fall within the protection scope of the appended claims of the present disclosure.

What is claimed is:

1. A display panel, comprising:
   a base; and
   a thin film transistor (TFT) layer, disposed on the base and comprising at least two TFTs arranged in parallel; wherein
   the TFT layer comprises: a first metal layer, a semiconductor layer, and a second metal layer that are sequentially disposed on the base in a stacked manner, the first metal layer comprises at least gates of the TFTs and a first connection portion connecting the gates in parallel; the second metal layer comprises at least first electrodes and second electrodes of the TFTs, a second connection portion connecting the first electrodes in parallel, and a third connection portion connecting the second electrodes in parallel; and in one TFT, an orthographic projection of the gate on the base covers orthographic projections of the first electrode and the second electrode on the base.

2. The display panel as claimed in claim 1, wherein the TFT layer comprises a plurality of TFTs arranged in parallel, any two adjacent TFTs are arranged in sequence in a first direction or a second direction, and the first direction is set to be at a preset angle to the second direction;
the TFT layer comprises gap regions located between the TFTs, and the gap region comprises a cutting region and a non-cutting region; and
the first connection portion is located in the cutting region, one of the second connection portion and the third connection portion is located in the cutting region, and the other is located in the non-cutting region.

3. The display panel as claimed in claim 2, wherein the cutting region comprises a first cutting region, the non-cutting region comprises a first non-cutting region, and the first cutting region and the first non-cutting region are located between two adjacent TFTs arranged in the first direction;
the first connection portion comprises a first connection sub-portion located in the first cutting region, and the second connection portion comprises a second connection sub-portion located in the first non-cutting region; and
an orthographic projection of the first cutting region on the base does not overlap an orthographic projection of the first non-cutting region on the base.

4. The display panel as claimed in claim 3, wherein in the second direction, a width of an orthographic projection of any one of the gates on the base is greater than a width of an orthographic projection of the first connection sub-portion on the base.

5. The display panel as claimed in claim 2, wherein the cutting region comprises a second cutting region, the non-cutting region comprises a second non-cutting region, the second cutting region and the second non-cutting region are located between two adjacent TFTs arranged in the second direction, and the second non-cutting region and the second cutting region are arranged in the second direction;
the first connection portion comprises a third connection sub-portion located in the second cutting region, and the second connection portion comprises a fourth connection sub-portion located in the second non-cutting region; and
an orthographic projection of the second cutting region on the base does not overlap an orthographic projection of the second non-cutting region on the base.

6. The display panel as claimed in claim 5, wherein in the second direction, a width of the orthographic projection of the second cutting region on the base is greater than a width of the orthographic projection of the second non-cutting region on the base.

7. The display panel as claimed in claim 5, wherein the second cutting region comprises a first cutting subregion and a second cutting subregion, the second non-cutting region comprises at least one first non-cutting subregion located between the first cutting subregion and the second cutting subregion, and the first cutting subregion, the second cutting subregion, and the first non-cutting subregion are disposed in the second direction.

8. The display panel as claimed in claim 7, wherein the first electrode comprises a plurality of first teeth portions arranged in parallel and spaced apart from each other, the plurality of first teeth portions are communicated by using the second connection portion; the second electrode comprises a plurality of second teeth portions arranged in parallel and spaced apart from each other, the plurality of second teeth portions are communicated by the third connection portion; and the plurality of first teeth portions and the plurality of second teeth portions are alternately disposed in the first direction, and the second teeth portion is at least partially located in the second cutting region.

9. The display panel as claimed in claim 8, wherein the third connection sub-portion comprises a plurality of first connection sections that are disposed at intervals and correspond to the plurality of second teeth portions, and an orthographic projection of the second teeth portion on the base is located at a gap between adjacent first connection sections.

10. The display panel as claimed in claim 2, wherein the TFT layer further comprises a semiconductor layer located between the first metal layer and the second metal layer, the semiconductor layer comprises semiconductor sublayers of the TFTs and a fourth connection portion connecting the semiconductor sublayers in parallel, and the fourth connection portion is located in the non-cutting region; and
an orthographic projection of the semiconductor sublayer on the base is located within the orthographic projection of the gate on the base.

11. A mobile terminal, comprising a display panel and a terminal body, wherein the terminal body is integrated with the display panel, and the display panel comprises:
a base; and
a thin film transistor (TFT) layer, disposed on the base and comprising at least two TFTs arranged in parallel; wherein
the TFT layer comprises: a first metal layer, a semiconductor layer, and a second metal layer that are sequentially disposed on the base in a stacked manner, and the first metal layer comprises at least gates of the TFTs and a first connection portion connecting the gates in parallel; the second metal layer comprises at least first electrodes and second electrodes of the TFTs, a second connection portion connecting the first electrodes in parallel, and a third connection portion connecting the second electrodes in parallel; and in one TFT, an orthographic projection of the gate on the base covers orthographic projections of the first electrode and the second electrode on the base.

12. The mobile terminal as claimed in claim 11, wherein the TFT layer comprises a plurality of TFTs arranged in parallel, any two adjacent TFTs are arranged in sequence in a first direction or a second direction, and the first direction is set to be at a preset angle to the second direction;
the TFT layer comprises gap regions located between the TFTs, and the gap region comprises a cutting region and a non-cutting region; and
the first connection portion is located in the cutting region, one of the second connection portion and the third connection portion is located in the cutting region, and the other is located in the non-cutting region.

13. The mobile terminal as claimed in claim 12, wherein the cutting region comprises a first cutting region, the non-cutting region comprises a first non-cutting region, and the first cutting region and the second cutting region are located between two adjacent TFTs arranged in the first direction;
the first connection portion comprises a first connection sub-portion located in the first cutting region, and the second connection portion comprises a second connection sub-portion located in the first non-cutting region; and an orthographic projection of the first cutting region on the base does not overlap an orthographic projection of the first non-cutting region on the base.

14. The mobile terminal as claimed in claim 13, wherein in the second direction, a width of an orthographic projection of any one of the gates on the base is greater than a width of an orthographic projection of the first connection sub-portion on the base.

15. The mobile terminal as claimed in claim 12, wherein the cutting region comprises a second cutting region, the non-cutting region comprises a second non-cutting region, the second cutting region and the second non-cutting region are located between two adjacent TFTs arranged in the second direction, and the second non-cutting region and the second cutting region are arranged in the second direction;

the first connection portion comprises a third connection sub-portion located in the second cutting region, and the second connection portion comprises a fourth connection sub-portion located in the second non-cutting region; and an orthographic projection of the second cutting region on the base does not overlap an orthographic projection of the second non-cutting region on the base.

16. The mobile terminal as claimed in claim 15, wherein in the second direction, a width of the orthographic projection of the second cutting region on the base is greater than a width of the orthographic projection of the second non-cutting region on the base.

17. The mobile terminal as claimed in claim 15, wherein the second cutting region comprises a first cutting subregion and a second cutting subregion, the second non-cutting region comprises at least one first non-cutting subregion located between the first cutting subregion and the second cutting subregion, and the first cutting subregion, the second cutting subregion, and the first non-cutting subregion are disposed in the second direction.

18. The mobile terminal as claimed in claim 17, wherein the first electrode comprises a plurality of first teeth portions arranged in parallel and spaced apart from each other, the plurality of first teeth portions are communicated by using the second connection portion; the second electrode comprises a plurality of second teeth portions arranged in parallel and spaced apart from each other, the plurality of second teeth portions are communicated by using the third connection portion; and the plurality of first teeth portions and the plurality of second teeth portions are alternately disposed in the first direction, and the second teeth portion is at least partially located in the second cutting region.

19. The mobile terminal as claimed in claim 18, wherein the third connection sub-portion comprises a plurality of first connection sections that are disposed at intervals and correspond to the plurality of second teeth portions, and an orthographic projection of the second teeth portion on the base is located at a gap between adjacent first connection sections.

20. The mobile terminal as claimed in claim 12, wherein the TFT layer further comprises a semiconductor layer located between the first metal layer and the second metal layer, the semiconductor layer comprises semiconductor sublayers of the TFTs and a fourth connection portion connecting the semiconductor sublayers in parallel, and the fourth connection portion is located in the non-cutting region; and an orthographic projection of the semiconductor sublayer on the base is located within the orthographic projection of the gate on the base.

* * * * *